US010613691B2

(12) United States Patent
Bruce et al.

(10) Patent No.: US 10,613,691 B2
(45) Date of Patent: Apr. 7, 2020

(54) DOWNHOLE APPARATUS

(71) Applicant: HALLIBURTON MANUFACTURING AND SERVICES LIMITED, London (GB)

(72) Inventors: Stephen Edmund Bruce, Aberdeen (GB); Stephen Kent, Aberdeen (GB); Dominic Patrick Joseph McCann, Aberdeen (GB); David Allan Noblett, Aberdeen (GB); David Grant, Aberdeen (GB); Ewan Colin Smith, Aberdeen (GB)

(73) Assignee: HALLIBURTON MANUFACTURING AND SERVICES LIMITED, London (GB)

( * ) Notice: Subject to any disclaimer, the term of this patent is extended or adjusted under 35 U.S.C. 154(b) by 169 days.

(21) Appl. No.: 15/815,596

(22) Filed: Nov. 16, 2017

(65) Prior Publication Data

US 2018/0081468 A1 Mar. 22, 2018

Related U.S. Application Data

(63) Continuation of application No. 14/382,806, filed as application No. PCT/GB2013/050562 on Mar. 7, 2013, now Pat. No. 9,851,852.

(30) Foreign Application Priority Data

Mar. 7, 2012 (GB) .................................. 1203986.3

(51) Int. Cl.
E21B 43/10 (2006.01)
G06F 3/044 (2006.01)
(Continued)

(52) U.S. Cl.
CPC .............. *G06F 3/044* (2013.01); *E21B 23/04* (2013.01); *E21B 33/1208* (2013.01);
(Continued)

(58) Field of Classification Search
CPC ...... E21B 43/103; E21B 43/105; E21B 34/08; E21B 34/10; E21B 34/007; E21B 33/127
(Continued)

(56) References Cited

U.S. PATENT DOCUMENTS 1,620,412 A 3/1927 Tweendale
2,603,293 A 7/1952 Lynes
(Continued)

FOREIGN PATENT DOCUMENTS

CN 101784749 A 7/2010
EP 0995475 A1 4/2000
(Continued)

OTHER PUBLICATIONS

Intellectual Property Office, Search Report for Application No. GB1203986.3, dated Jun. 7, 2012, 3 pages, United Kingdom.
(Continued)

*Primary Examiner* — William D Hutton, Jr.
*Assistant Examiner* — Steven A Macdonald

(57) ABSTRACT

A downhole apparatus including a tubular body, first and second ports in a wall of the body, and a fluid pressure-responsive valve arrangement having a locked first configuration associated with a first pressure in which the first port is open and the second port is closed, an unlocked second configuration associated with a second pressure higher than the first pressure in which the first port is open and the second port is closed, and a third configuration associated with a third pressure lower than the second pressure in which the second port is open and the first port is closed.

18 Claims, 14 Drawing Sheets

STAGE 1-RIH

(51) Int. Cl.
    *E21B 43/08*     (2006.01)
    *E21B 43/12*     (2006.01)
    *E21B 23/04*     (2006.01)
    *E21B 33/12*     (2006.01)
    *E21B 34/10*     (2006.01)
    *G06F 3/047*     (2006.01)
    *H03K 17/96*     (2006.01)

(52) U.S. Cl.
    CPC .............. *E21B 34/10* (2013.01); *E21B 43/08* (2013.01); *E21B 43/086* (2013.01); *E21B 43/10* (2013.01); *E21B 43/103* (2013.01); *E21B 43/108* (2013.01); *E21B 43/12* (2013.01); *G06F 3/047* (2013.01); *H03K 17/9622* (2013.01); *H03K 2017/9602* (2013.01)

(58) Field of Classification Search
    USPC .................................... 137/68.14–68.17, 797
    See application file for complete search history.

(56) References Cited

U.S. PATENT DOCUMENTS

| | | | |
|---|---|---|---|
| 3,503,445 | A | 3/1970 | Cochrum et al. |
| 3,606,924 | A | 9/1971 | Malone |
| 3,937,281 | A | 2/1976 | Hamsberger |
| 4,082,298 | A * | 4/1978 | Sanford ................ E21B 33/127 166/187 |
| 4,428,423 | A | 1/1984 | Koehler et al. |
| 4,770,256 | A | 9/1988 | Lipsker et al. |
| 4,843,700 | A | 7/1989 | Arai |
| 4,934,460 | A | 6/1990 | Coronado |
| 5,901,789 | A | 5/1999 | Donnelly et al. |
| 6,012,522 | A | 1/2000 | Donnelly et al. |
| 6,220,357 | B1 | 4/2001 | Carmichael et al. |
| 6,412,565 | B1 | 7/2002 | Castano-Mears |
| 6,457,518 | B1 | 10/2002 | Castano Mears et al. |
| 7,814,973 | B2 | 10/2010 | Dusterhoft et al. |
| 8,291,972 | B2 | 10/2012 | Dusterhoft et al. |
| 8,336,618 | B2 | 12/2012 | Jones et al. |
| 8,881,804 | B2 | 11/2014 | Kang et al. |
| 9,016,365 | B2 | 4/2015 | Kang et al. |
| 2002/0070023 | A1 | 6/2002 | Turner et al. |
| 2004/0261994 | A1 | 12/2004 | Nguyen et al. |
| 2005/0155772 | A1 | 7/2005 | Dusterhoft et al. |
| 2005/0161232 | A1 | 7/2005 | Patel et al. |
| 2008/0121390 | A1 | 5/2008 | O'Malley et al. |
| 2009/0173497 | A1 | 7/2009 | Dusterhoft et al. |
| 2010/0051262 | A1 | 3/2010 | Dusterhoft et al. |
| 2010/0051271 | A1 | 3/2010 | Gano et al. |
| 2010/0186969 | A1 | 7/2010 | Metcalfe |
| 2010/0258302 | A1 | 10/2010 | Bonner et al. |
| 2011/0036567 | A1 | 2/2011 | Holderman et al. |
| 2013/0341005 | A1 | 12/2013 | Bruce et al. |

FOREIGN PATENT DOCUMENTS

| | | | |
|---|---|---|---|
| EP | 1892373 | A1 | 2/2008 |
| EP | 2295716 | A2 | 3/2011 |
| EP | 2631423 | A1 | 8/2013 |
| GB | 2314863 | A | 1/1998 |
| GB | 2398313 | A | 8/2004 |
| GB | 2404676 | A | 2/2005 |
| GB | 2424020 | A | 9/2006 |
| GB | 2437525 | A | 10/2007 |
| GB | 2440066 | A | 1/2008 |
| WO | WO-2008067154 | A2 | 6/2008 |
| WO | WO-2009001069 | A2 | 12/2008 |
| WO | WO-2011079391 | A1 | 7/2011 |

OTHER PUBLICATIONS

Intellectual Property Office, Search Report for Application No. GB1203986.3, dated Nov. 20, 2012, 2 pages, United Kingdom.

Intellectual Property Office, Combined Search and Examination Report for Application No. GB1303728.8, dated Apr. 12, 2013, 3 pages, United Kingdom.

Intellectual Property Office, Combined Search and Examination Report for Application No. GB1303729.6, dated May 1, 2013, 3 pages, United Kingdom.

Intellectual Property Office, Search and Examination Report for Application No. GB1303729.6, dated Jul. 9, 3013, 3 pages, United Kingdom.

Intellectual Property Office, Search and Examination Report for Application No. GB1303729.6, dated Jul. 31, 2013, 3 pages, United Kingdom.

Intellectual Property Office, Combined Search and Examination Report for Application No. GB1318899.0 dated Nov. 14, 2013, 6 pages, United Kingdom.

Intellectual Property Office, Combined Search and Examination Report for Application No. GB1318896.6 dated Nov. 14, 2013, 3 pages, United Kingdom.

European Patent Office, International Search Report for International Application No. PCT/GB2013/050562, dated Jul. 7, 2014, 8 pages, Europe.

The State Intellectual Property Office of the People's Republic of China, Application No. 201380023121.1, Third Office Action, dated Aug. 29, 2017, 7 pages, China.

The State Intellectual Property Office of the People's Republic of China, Application No. 201380023121.1, Third Office Action, dated Aug. 29, 2017, 12 pages, English Translation, China.

Australian Government IP Australia, Examination report No. 1, Application No. 2017265078, dated Nov. 28, 2018, 6 pages, Australia.

* cited by examiner

Completion Schematic with 3 off Darcy Screens

STAGE 1-RIH

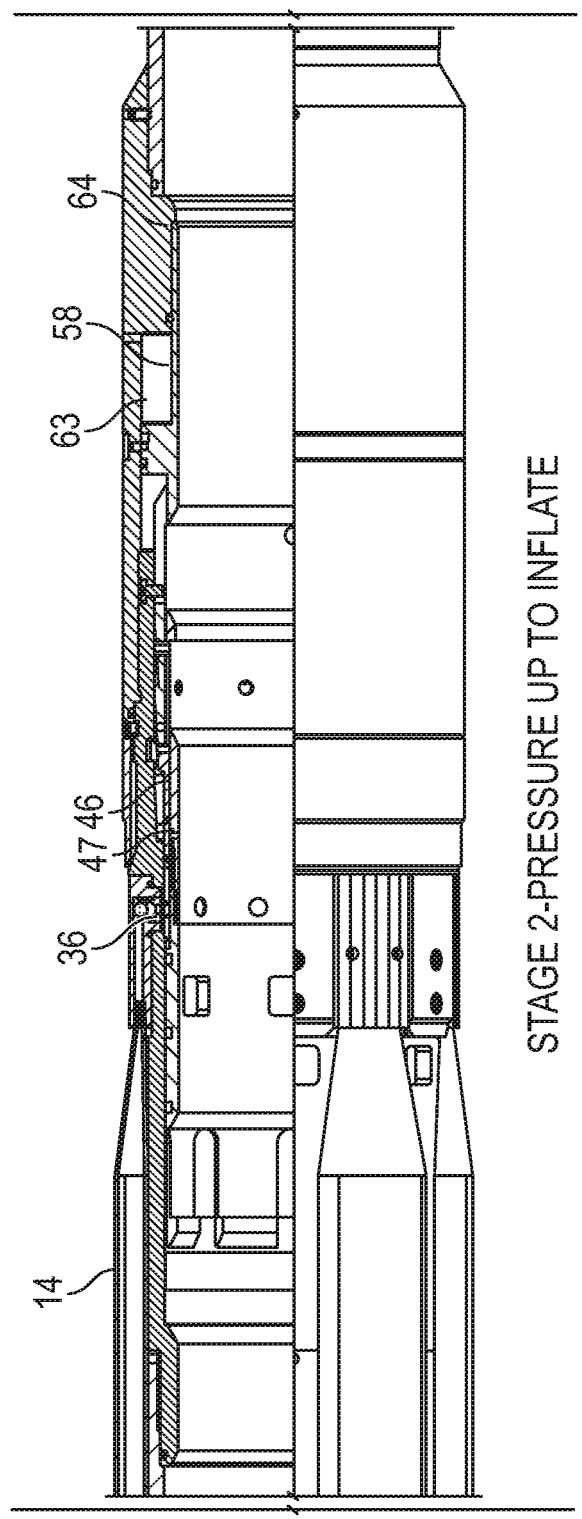
FIG. 5 STAGE 2-PRESSURE UP TO INFLATE

STAGE 3-BLEED PRODUCTION BORE PRESSURE

STAGE 4-MECHANICALLY SHUT OFF PRODUCTION

DOWNHOLE APPARATUS

REFERENCE TO RELATED APPLICATIONS

This application is a continuation patent application of U.S. application Ser. No. 14/382,806, filed on Sep. 4, 2014, which is a United States National Phase application of PCT Application No. PCT/GB2013/050562 filed Mar. 7, 2013, which claims priority to United Kingdom Application No. GB 1203986.3 filed Mar. 7, 2012, the benefit of each of which is claimed and the disclosure of each of which is incorporated herein by reference in its entirety.

FIELD OF THE INVENTION

This invention relates to downhole apparatus and in particular, but not exclusively, to flow control apparatus such as sand screens and associated apparatus and methods.

BACKGROUND OF THE INVENTION

WO 2009/001069 and WO 2009/001073, the disclosures of which are incorporated herein in their entirety, describe arrangements for supporting borehole walls and for applying predetermined stresses to borehole walls. Inflatable chambers are mounted on a base pipe such that inflation of the chambers increases the diameter of the assembly. The chambers may support a sand control element.

SUMMARY OF THE INVENTION

According to the present invention, there is provided downhole apparatus including a tubular body, first and second ports in a wall of the body, and a fluid pressure-responsive valve arrangement having a locked first configuration associated with a first pressure in which the first port is open and the second port is closed, an unlocked second configuration associated with a second pressure higher than the first pressure in which the first port is open and the second port is closed, and a third configuration associated with a third pressure lower than the second pressure in which the second port is open.

According to another aspect of the invention, there is provided a flow control method including applying a first pressure to a fluid pressure-responsive valve arrangement, controlling the configuration of first and second ports in a wall of a tubular body, whereby the valve arrangement maintains a locked first configuration in which the first port is open and the second port is closed, applying a second pressure higher than the first pressure whereby the valve arrangement assumes an unlocked second configuration in which the first port is open and the second port is closed, and applying a third pressure lower than the second pressure whereby the valve arrangement assumes a third configuration in which the second port is open.

The valve arrangement configuration may change in any appropriate sequence, for example, the first configuration being followed by the second configuration, which is then followed by the third configuration. Alternatively, the third configuration may be followed by the second configuration, which is then followed by the first configuration.

The locked first configuration may be an initial configuration for the valve arrangement. Thus, for example, the apparatus may be run into a bore in the first configuration.

The first port may be closed in the third configuration.

The first port may include a check valve which closes the first port in the absence of a positive pressure differential across the valve.

The valve arrangement may include a valve member which closes the second port in the first and second configurations. The valve member may close the first port in the third configuration. The valve member may take any appropriate form, and may be a sleeve. The valve member may be biased towards a position to open the second port.

The valve arrangement may be locked in the first configuration by a lock arrangement which may include a releasable retaining member, such as a shear pin. The retaining member may retain a valve member in a first configuration relative to the body.

The valve arrangement may include more than one lock arrangement, for example elements of the valve arrangement may be locked in position when the valve arrangement is in the third configuration.

The valve arrangement may define a differential piston. One piston face may be exposed to an internal pipe pressure and a second piston face may be exposed to an external pressure, for example annulus pressure. Accordingly, a positive pressure differential between the pipe and the annulus will result in a fluid pressure force acting on the piston.

The piston may be accommodated in a chamber with a port providing fluid communication with an external pressure. The port may dimensioned or otherwise configured to induce a pressure drop in fluid passing through the port.

A pressure relief arrangement may be associated with the piston, whereby if the external pressure exceeds the internal pipe pressure, that is a negative pressure differential between the pipe and the annulus, the external pressure may be relieved, thus avoiding inadvertent or reverse activation of the piston. The external pressure may be relieved via a check valve or bleed valve which allows higher external pressure to bleed across from the external side of the piston to the internal side of the piston. The valve may be dimensioned or otherwise configured to induce a pressure drop in fluid passing through the valve. The form of the valve and the number of valves provided may be selected as appropriate. In one embodiment a port extends through the piston and accommodates a ball urged into sealing engagement with a seat by a spring. Of course, those of skill in the art will recognize that such a pressure relief arrangement may have utility in other forms of downhole apparatus, particularly those that utilize differential pistons, in accommodating reverse pressure differentials which might otherwise have an adverse effect on the operation of a pressure actuated tool.

The first port may provide fluid communication with a first tool or device, for example a fluid-deformable device, such as a chamber mounted on the body. The fluid-deformable device may support a sand screen, such that the apparatus may be utilized to facilitate fluid pressure activation of a sand screen. In one embodiment, the first port provides communication between the interior of the body and a chamber which extends axially along the exterior of the body.

The second port may provide fluid communication between the interior of the tubular body and the exterior of the tubular body and be configured to, for example, permit flow of production fluid from a formation into the body, or to permit the passage of fluid, such as injection, fracking or treatment fluid, from the body and into the formation. In some embodiments the second port may be utilized for passage of a fluid from the tubular body into the formation, and at some other time for passage of a fluid from the formation into the tubular body. The second port may be configured with an inflow control device (ICD) and thus the apparatus may be utilized to facilitate fluid pressure activation of an ICD.

In one embodiment the second port includes an ICD in the form of an insert, for example an insert of erosion resistant material such as tungsten carbide. A disc or other member may be provided with an insert and the disc may be adapted to be located in a second port. The form of the insert may be selected to provide a predetermined pressure drop in fluid flowing through the port. In some discs a blank insert may be provided, preventing flow through the second ports.

One or more valve arrangements may be incorporated in a completion and provided one or more second ports provided with ICDs. Thus, based on surveys or other well profiling information, an operator may configure the ICDs to provide a desired flow profile from the surrounding formations and into the well.

The apparatus may include two or more valve arrangements and associated first and second ports. Each valve arrangement may be associated with a respective tool or device, for example each apparatus may be associated with a respective bore wall-supporting apparatus, packer, hanger, or sand screen. The valve arrangements and associated tools or devices may be axially spaced along the tubular body. Alternatively, or in addition, valve arrangements and associated tools or devices may be circumferentially spaced around the tubular body. Thus, multiple valve arrangements may be activated simultaneously.

The valve arrangement may be arranged in a fourth configuration with the second port closed. The valve arrangement may be adapted for mechanical actuation to the fourth configuration. Thus, for example, in the fourth configuration the apparatus may prevent flow of production or other fluid from a formation into a completion, or prevent flow of fluid from a completion or other body into a formation.

The apparatus may include fluid deformable members or chambers mounted on a base pipe, which members may be adapted to be activated by fluid passing through the first port. The activated members may provide support for filter media, and may be utilized to locate filter media, such as a sand screen, in contact with a bore wall, or to increase the diameter described by filter media. The activated members may be adapted to provide support for a bore wall, or to load or compress material between the members and a bore wall, with or without provision of filter media, thus providing the beneficial effects as described in WO2009/001069 and WO2009/001073. A check valve or the like may be associated with the first port, for retaining fluid in the fluid deformable members. Alternatively, or in addition, relief valves or the like may be associated with the fluid deformable members, the valves being configured to release pressure from the members to avoid over-inflation. Furthermore, the apparatus may be configured to permit deflation or de-activation of the members, for example by provision of appropriate valves, thus facilitating removal or retrieval of an apparatus from a bore, although in most cases it is likely that the apparatus will be intended for permanent installation.

An aspect of the present invention relates to provision of a tubular body forming part of a completion including one or more sand screens, each screen incorporating an apparatus in accordance with the invention. The first ports may communicate with fluid deformable members or chambers mounted on a base pipe, the chambers supporting a filter member. The screens may be run into a drilled hole to the desired depth with the valve arrangement in the locked configuration. A first pressure is then applied to the inside of the completion and fluid may pass through the first ports to simultaneously and at least partially inflate the chambers, increasing the diameter of the screens to locate the filter members against the surrounding bore wall or casing. The pressure applied is then increased to a higher second pressure and the valve arrangement assumes the unlocked second configuration. This may be achieved by provision of a valve member in the form of a sleeve and which incorporates a differential piston, the valve member being initially locked in position by a shear pin. The higher second pressure may shear the pin and move the sleeve a small distance, against the action of a spring, maintaining the first port open and the second port closed. The pressure may then be further increased to fully inflate and activate the chambers; the pressure necessary to cause the pins to shear may be less than the pressure necessary to fully activate the chambers. Maintaining the pressure at this elevated level for a period of time ensures that all the pins shear and all of the screens are fully activated against the borehole. The activated screens may thus be compliant with the wall of the wellbore, that is the screens will tend to follow and maintain contact with the wellbore surface, even if the surface is non-cylindrical or otherwise irregular. Pressure is then bled off from the completion, check valves associated with the first ports locking the elevated pressure inside the chambers and maintaining to sleeves fully activated. As pressure continues to be bled off, the sleeves are moved by the springs to assume the third configuration in which the first ports are closed and the second ports are open. An additional barrier may be provided to close the first ports, for example a shuttle valve may be provided between the first ports and the valve sleeve and may be positioned to close the first ports. Production fluid may then flow from the formation, through the filter member and the second ports and into the completion, and then to surface. In other embodiments the apparatus may be used to control the flow of fluid in the opposite direction, for example the flow of injection, fracking or treatment fluid into the formation.

Thus the screens may be fully activated by modulation of the pressure applied to the inside of the completion. If desired, the entire completion or a section of completion may be pressurized to simultaneously activate all of the screens or a number of screens provided in the pressurized section, which in the great majority of cases will be achievable without provision of specialist equipment or expertise. Furthermore, no intervention is required, increasing the speed and reliability of the operation. Alternatively, screens may be activated individually or in groups, for example by utilising an appropriate tool or device to isolate individual screens or groups of screens. This allows different activation pressures to be utilized for selected screens and for selected locations in the well.

The completion will typically be intended to be a permanent installation. However, the completion, or indeed any other embodiment of the invention, may be configured to be retrievable or removable, typically by permitting deflation and deactivation of the chambers.

Where the apparatus includes fluid deformable members or chambers mounted on a base pipe which have been activated by fluid passing through the first port, the activated apparatus may provide a structure with improved crush and collapse resistance.

According to another aspect of the present invention, there is provided downhole apparatus in the form of a fluid pressure deformable chamber for location on a base member, the chamber having a body having a first portion of a first length, width and depth, a second portion having at least one of a second depth and width less than the first portion, and a transition portion coupling the first and second portions and configured to provide for a progression between deformation characteristics of the first and second portions.

The second portion may be utilized to locate or secure the chamber on the base member.

The second portion may form an end of the chamber, and a second portion and an associated transition portion may be provided at one or both ends of the chamber. On filling the chamber with fluid the depth of the chamber may increase. The pressure of fluid utilized to deform the chamber may be selected based on a number of criteria. For example, a pressure of between 1.4 and 5.5 MPa (200 and 800 psi) may be used to fully activate the chamber, but of course other ranges of pressure may be effective in other embodiments.

A plurality of chambers may be provided around a base member. The chambers may extend axially of the base member and be arranged side-by-side to provide substantially complete circumferential coverage of the base member. The chambers may support a member or device, for example a filter member, such as a sand screen.

The chamber may have a wall formed to match the profile of an associated base member. Typically, the chamber will have an arcuate inner wall where the chamber is intended to be mounted externally of a cylindrical base member. As the chamber is filled with fluid an outer wall moves radially outwards, increasing the depth of the chamber and the diameter of the assembly. The chamber may have an arcuate outer wall intended to match the surface of a surrounding bore wall.

The chamber may include an activation port to provide for passage of chamber-deforming fluid. The port may be provided at any appropriate location on the chamber. The port may be provided in the second portion, at an end of the chamber, which may form a spigot. The activation port may be located on a main axis of the chamber. The associated spigot may have, initially at least, the same depth as the body.

The first width and depth may be substantially constant along the length of the body.

A fluid port may be provided at the other end of the chamber. Alternatively, the other end of the chamber may be closed or sealed and may serve primarily to locate the end of the chamber relative to the base member. A port at the chamber end may be open to, for example, facilitate filling of the chamber during fabrication or assembly to remove air from the chamber, to accommodate a pressure relief valve, or to provide for communication with another chamber, for example a chamber on an adjacent device, which device may be a sand screen.

Edges of the transition portion may feature an inner radius and an outer radius. The inner radius reduces stresses in the transition portion as the chamber is deformed. The outer radius also reduces stresses in the transition portion as the chamber is deformed. Additionally, the outer radius reduces length and width shrinkage of the chamber as the chamber is deformed. The outer radius also reduces the potential for damaging a filter member extending over the chamber and tends to provide a smoother profile in the deformed chamber.

The transition portion may be configured to cooperate with a chamber block defining a fluid passage. The chamber block may be configured to maintain its form while the chamber is deformed. The block may define a female port configured to receive the transition portion. The transition portion may be bonded to the block, for example by welding, to provide a pressure-tight seal between the chamber and the block. The block may be configured to be secured to a base member. The chamber may be bonded to the block prior to the block being secured to the base member. Accordingly, the transition portion and block may be, for example, welded around the complete periphery to ensure pressure integrity before the assembly is mounted on the base member. The block may include an inlet port in an inner wall. The inlet port may include a check valve. The inlet port may be configured to communicate with the first port of the first aspect of the invention.

According to another aspect of the present invention, there is provided a method of connecting a fluid pressure-deformable chamber having an activation port at an end of the chamber to a base member, the method including forming a sealed connection between the activation port and a chamber block and then mounting the chamber block on the base member.

The block may take any appropriate form and may be relatively rigid with respect to the chamber such that the block substantially maintains its form when the chamber is deformed. The block may include a valve.

The activation port may be provided in a transition portion as described above.

According to a further aspect of the present invention, there is provided a support layer for location between a downhole filter member and an associated base member, the support layer including a sheet of material, the sheet being apertured and formed to provide a fluid path.

This aspect of the invention permits the support layer to function as a drainage layer.

The support layer may be formed of a curved sheet.

The support layer may feature surface protrusions to space the sheet from an adjacent member. Alternatively, or in addition, the layer may have an undulating form, for example the layer may be corrugated or otherwise define peaks and troughs, or the layer may be formed of overlapping members, or multiple layers may be provided and adjacent layers overlapped.

The support layer may be utilized in a sand screen as used in the production of hydrocarbons from subterranean formations.

The support layer may include a plurality of members.

The support layer may be formed of any suitable material. The layer may comprise a solid sheet, for example solid steel plate, although other materials may be utilized.

The apertures may take any appropriate form, pattern, shape or size. For example, rows of openings may be punched or pressed from the sheet. In use, the apertures may allow passage of oil or gas.

The apertures may be of a consistent form over the support layer. Alternatively, the form of the apertures may be varied to control the passage of fluid through the layer, and in particular to equalize flow through the layer over the length of the layer. For example, the number or dimensions of apertures may increase or decrease along the length of the layer depending of the distance between the apertures and a valve or flow port in the base support. Typically, apertures spaced further from the flow port will provide a larger flow area to compensate for the pressure drop that will occur as the fluid flows from the apertures to the flow port.

If the support layer is provided with protrusions these may take any appropriate form, pattern, shape, size or depth. The protrusions may lift or space the support layer from the base member, allowing oil or gas to flow beneath between the layer and the base member. The protrusions may be arranged to allow fluid to flow one or both of axially and circumferentially.

The protrusions may be formed by embossing a pattern in the sheet of material to create protrusions on the inner surface.

The support layer may be formed to match the profile or form of one or both of the filter member and base member. The support layer may be provided in combination with fluid pressure-deformable base members or activation chambers, such as described in relation to the other aspects of the invention, and a support layer member may be configured to provide a bridge between adjacent activation chambers, to ensure support for the filter member, particularly as the chambers are activated and gaps open up between the chambers, and to provide radial support for the surrounding well bore wall. The support layer may also assist in maintaining the circular form of the screen as the screen is activated. In other aspects of the invention, the activation chambers may have surfaces formed to provide a fluid pathway along the surface of the support member.

According to another aspect of the invention, there is provided a retainer for a sand screen filter member including a clamp member configurable to clamp at least an end portion of a filter member against a clamp body configured for securing to a base member.

According to a still further aspect of the present invention, there is provided a method of retaining a filter member on a sand screen, the method including locating the filter member around a base member and clamping at least end portions of the filter member against the base member.

The filter member may be in the form of a weave. The filter member may be wrapped around the base member.

The clamp member may include an axially translatable retainer having a clamping surface configured to cooperate with an opposing clamping surface on the clamp body, whereby a portion of the filter member may be secured between the surfaces. The clamping surfaces may define tapers.

The clamp member may be a clamp ring and may be threaded or otherwise securable to the clamp body. Where a threaded clamp ring is provided, relative rotation of the clamp ring and clamp body may induce axial movement of the clamp ring on the clamp body.

The clamp body may be integral with the base member. Alternatively, the clamp body may be separate from the base member, and may float at least axially relative to the base member. This arrangement facilitates in accommodating axial shrinkage of the filter member if the filter member is to be subject to expansion.

The clamp body may be recessed beyond the clamp body clamping surface to accommodate an end of the filter member. If necessary or desirable, the filter member may be spot welded in the recess during assembly to retain the filter member in place before the clamp member is fixed to the clamp body.

The invention also relates to a sand screen incorporating the retainer, and to a method of assembling a sand screen.

In one embodiment, filter media, which may be in the form of a weave, is wrapped around a base member having a clamp body secured at each end. The weave may be held in place, to facilitate assembly, using ratchet straps, spot welds, or the like. Spot welds may be provided along the length of the weave and the weave may be welded to the base member or to a support or drainage layer between the base member and the filter member. The ends of the weave are tightly wrapped around recesses in the clamp bodies. Clamp or retainer rings are then screwed onto the clamp bodies. The weave is trapped between tapers on the clamp ring and the clamp body, thus securing the weave in place around the base member.

According to a still further aspect of the present invention there is provided a method of restricting flow between zones in a well, the method including providing a layer of deformable material on a sand screen; and activating the sand screen such that the deformable material contacts and seals against the wall of the well.

The deformable material may be provided on a portion of the sand screen, for example at one or both ends of a sand screen.

The deformable material may be arranged on the sand screen such that fluid may pass beneath the material, for example through or beneath the sand screen.

The wall of the well may be lined, for example with casing or liner, or may be unlined.

The deformable material may be an elastomer, and may be a swellable material activated by water, oil, or some other material.

A method of increasing the strength of a base member including mounting chambers on the base member and inflating the chambers.

The member may take any appropriate form, and may be a hollow or solid member, for example a pipe or a beam.

The chambers may be arranged around a surface of the member and may extend axially of the member. The chambers may be provided on an outer surface of the base member, or on an inner surface of the base member.

The member may be restrained or contained within a bore or other surrounding wall. An external point load applied to a chamber, and which tends to deform the chamber wall, will tend to increase the internal fluid pressure in the chamber and result in the load being spread along the length of the chamber. Further, when a load is applied on one side of the member, the chambers on the other side of the member may be compressed between the member and the bore wall and radially distribute the reaction force over the opposite surface of the member. For tubular members, such as downhole structures, the provision of the chambers will thus enhance the collapse resistance of the members.

A method of creating a crush-resistant structure in accordance with an aspect of the present invention includes locating a base pipe in a bore and inflating chambers located between the base pipe and the bore with fluid, thereby providing a structure having an elevated crush resistance.

The structure may be compliant with the bore, that is an outer surface of the structure substantially follows the bore wall.

The structure may include a sand screen.

The structure may be located in a swelling formation or a formation with geo-mechanical movement.

According to another aspect of the present invention there is provided a shroud for a sand control apparatus, the shroud having elongate slots and the shroud being configured to be located on a sand control apparatus with the slots inclined to the longitudinal axis of the apparatus.

The shroud may be provided in combination with a sand control apparatus, for example a sand screen. The shroud may be positioned on the exterior of the apparatus, adjacent a sand control element. The sand control apparatus may be radially expandable, that is at least a portion of the apparatus may be activated to define a larger diameter.

The slots may be inclined at any appropriate angle, for example at 15 degrees to the longitudinal axis.

The inclination of the slots tends to increase the force or pressure required to extend or activate the shroud. Thus, the shroud may be utilized to control the activation of the apparatus. For example, where the activation is obtained by inflating pressure deformable chambers beneath the sand control element, the shroud may serve to control the pressure necessary to initiate activation. The inclination of the slots may also serve to reduce the friction between the shroud and the sand control element as the sand screen activates.

According to a further aspect of the invention there is provided a method of controlling the activation of a sand screen having a shroud surrounding a sand control element, the method including selecting the activation characteristics of the shroud such that the shroud controls the radial force at which activation of the sand screen is initiated.

This aspect of the invention has particular utility in sand screens which utilize fluid pressure to activate the screens. By selecting the shroud characteristics an operator may select the pressure which initiates activation. Thus, increases in pressure induced during other operations not intended to activate the screen lower pressures will not induce premature activation of the screen.

The various aspects of the invention as described above may be combined with one another as appropriate. Also, the various features described with reference to a particular aspect may be combined, individually or collectively, with the other aspects as appropriate.

BRIEF DESCRIPTION OF THE DRAWINGS

These and other aspects of the invention will now be described, by way of example, with reference to the accompanying drawings, in which:

FIGS. 4, 5, 6 and 7 are sectional views of a valve arrangement of one of the screens of FIG. 1, showing the valve arrangement in first, second, third and fourth configurations, respectively;

DETAILED DESCRIPTION OF THE DRAWINGS

Figure 1:
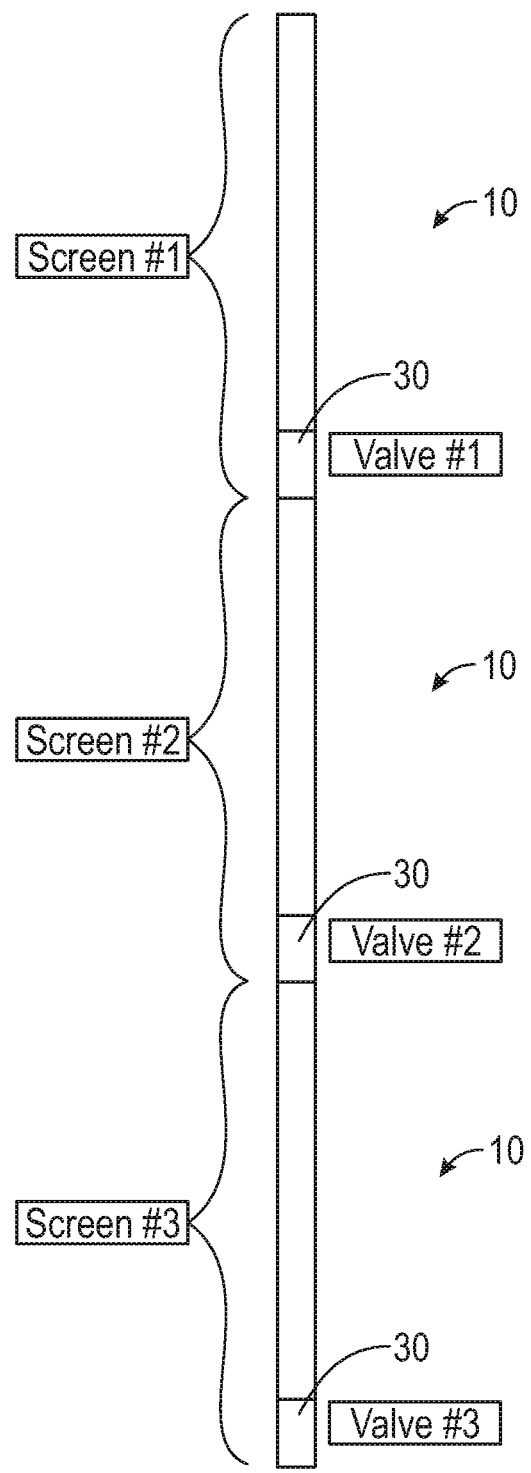
FIG. 1 is a schematic illustration of part of a completion including three sand screens in accordance with an embodiment of the present invention.

Reference is first made to FIG. 1 of the drawings, which is a schematic illustration of part of a well bore completion including three sand screens 10 in accordance with an embodiment of the present invention. Of course the completion will include many other elements and devices not shown in the drawing, such as a shoe on the leading end of the completion, packers for zonal isolation, hangers, valves and the like. Typically, a completion will incorporate more than three screens, the number of screens being selected as appropriate.

As will be described in further detail below, the screens 10 are run into the hole in a retracted or smaller diameter configuration and subsequently activated to assume a larger diameter configuration, in which the outer surface of the screens engages the bore wall, whether this be formed by casing, liner, or an unlined bore section.

Figure 2:
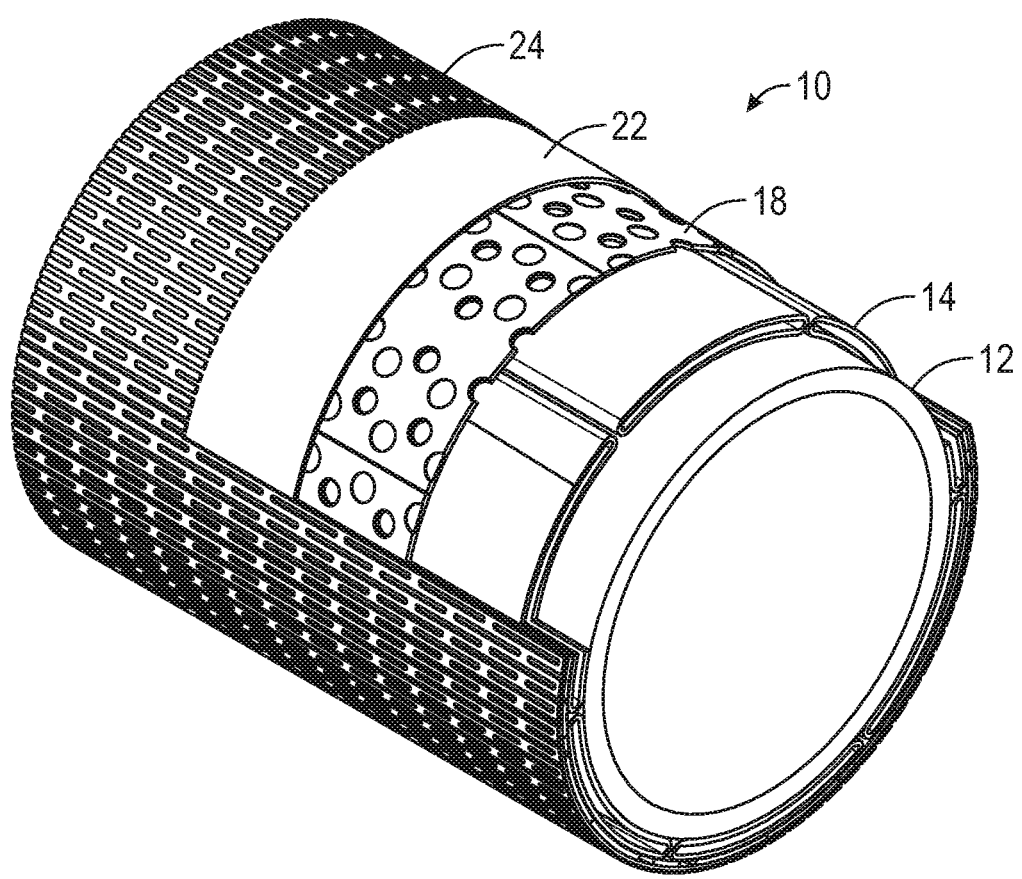
FIG. 2 is a part cut-away view of part of one of the screens of FIG. 1.
Figure 3:
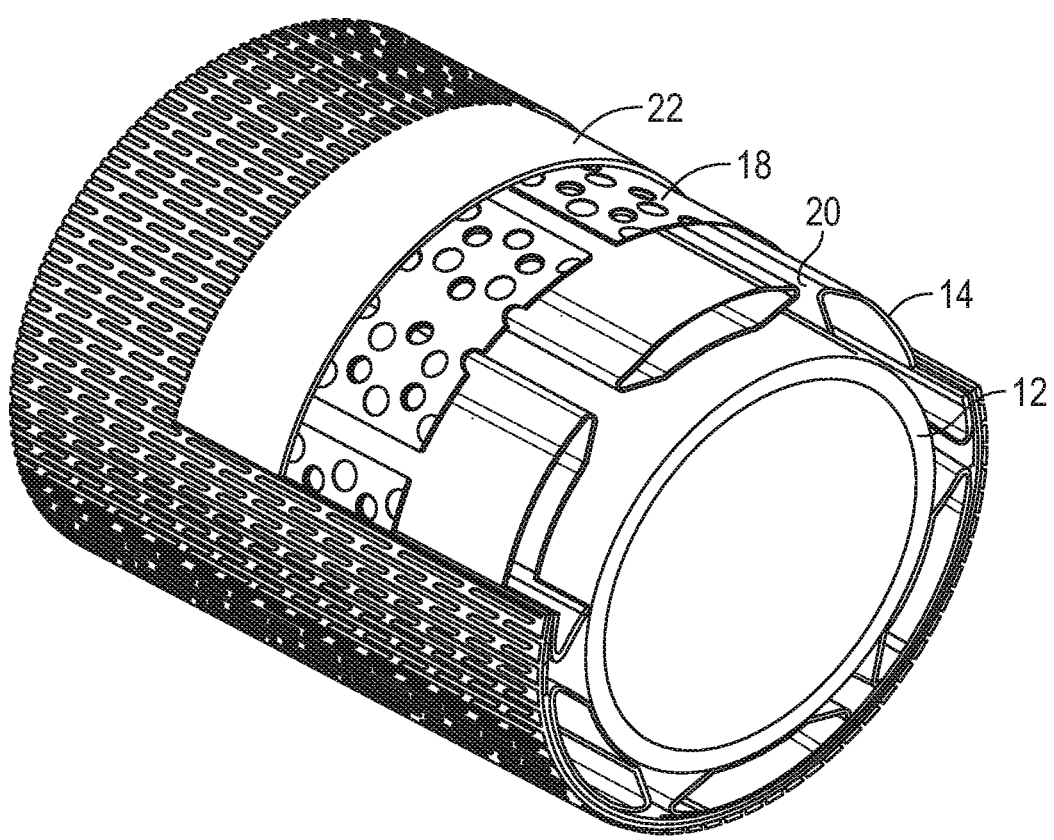
FIG. 3 corresponds to FIG. 2 but shows the screen in an activated configuration.

FIG. 2 of the drawings illustrates a part cutaway view of part of one of the screens of FIG. 1, showing the screen 10 in an initial configuration. The screen 10 includes a base pipe 12 providing mounting for six activation chambers 14 which extend axially along the outer surface of the base pipe 12. The chambers 14 are arranged side-by-side around the base pipe 12 and, as will be described, may be inflated or deformed by filling the chambers 14 with high pressure fluid such that the chambers 14 assume an activated configuration as illustrated in FIG. 3 of the drawings.

A drainage layer is located externally of the chambers 14, the layer including six strips 18 of apertured steel sheet. Like the chambers 14, the strips 18 are arranged side-by-side and extend axially along the screen 10, but are circumferentially offset relative to the chambers 14, as illustrated in the drawings, such that when the chambers 14 are extended the strips 18 bridge the gaps 20 formed between the chambers 14. Further detail relating to the drainage layer will be provided below.

The drainage layer supports a filter media in the form of a weave 22, the weave form being selected such that the aperture size of the weave 22 does not vary as the weave 22 is extended to accommodate the deformation of the activation chambers 14. The weave 22 may includes a single length of material wrapped around the drainage layer with the longitudinal edges overlapping, or may includes two or more lengths or strips of material. A protective shroud 24 is provided over the weave 22.

Reference is now also made to FIGS. 4, 5, 6 and 7 of the drawings, which are sectional view of a valve arrangement 30 of one of the screens 10 of FIG. 1, showing the valve arrangement in first, second, third and fourth configurations, respectively. In use, a valve arrangement 30 will be provided at the lower end of each screen 10 between the lower end of the activation chambers 14 and a stub acme connection 32 and a premium connection (not shown) at the end of the screen 10. It will be noted that FIGS. 4, 5, 6 and 7 omit the drainage layer 16, weave 22 and shroud 24.

The valve arrangement 30 includes a body 34 including a number of inter-connected cylindrical portions 34a, 34b which also form the lower end of the screen body. As will be described, the valve arrangement 30 also includes a number of generally cylindrical internal parts which are configurable to control passage of fluid through first and second ports 36, 38 in the body portion 34a. The first ports 36 provide communication with the activation chambers 14 via respective chamber blocks 40 which each incorporate a check valve 42 including a ball 44. The ball 44 may be formed of any suitable material, for example PTFE, ceramic, steel, rubber, brass or aluminium. The second ports 38 also extend through the body portion 34a and, when open, allow production fluid to flow from the exterior of the screen 10 into the base pipe 12, and subsequently to surface.

Figure 4:
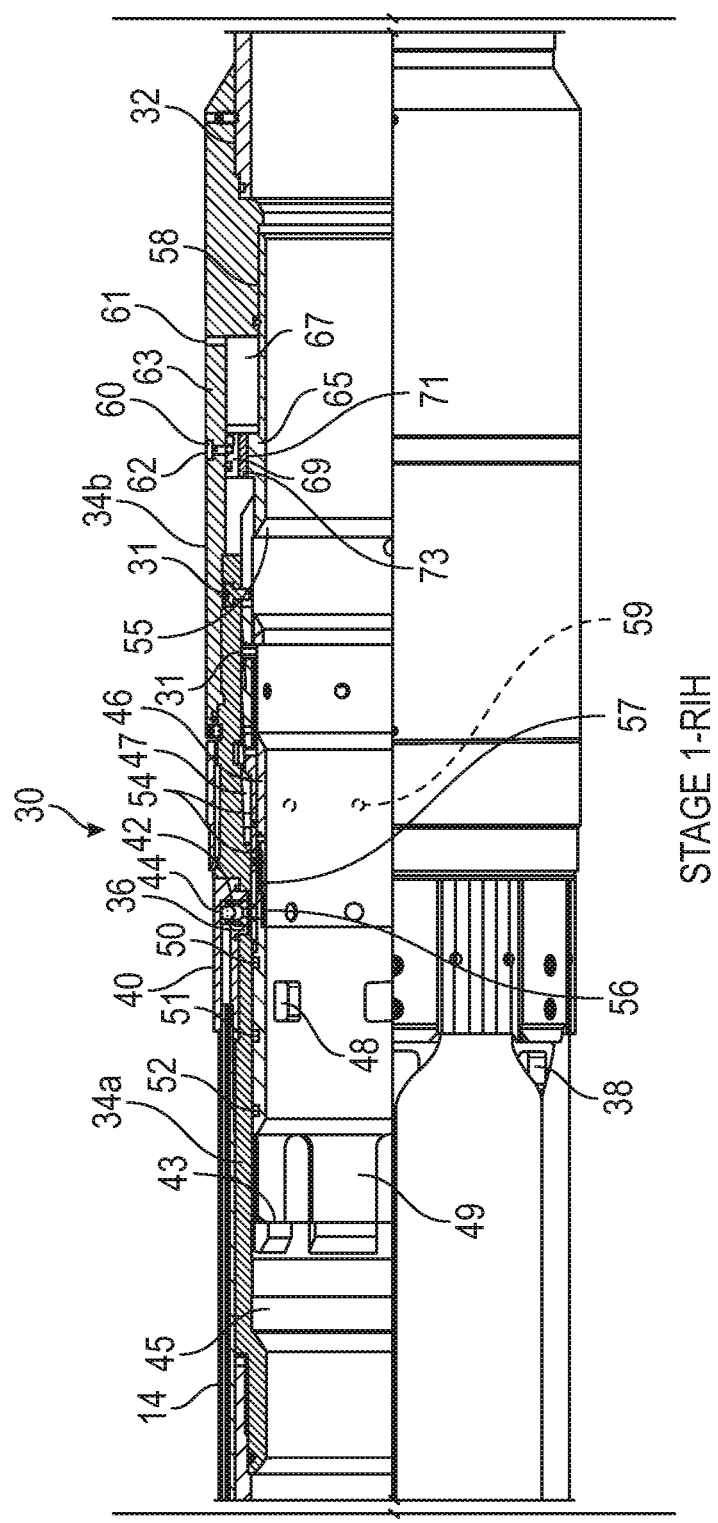
Figure 4A:
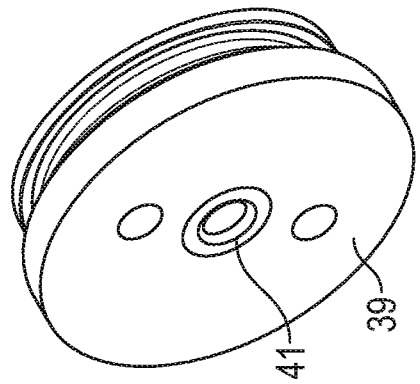
FIGS. 4a and 4b are views of an ICD insert assembly.
Figure 4B:
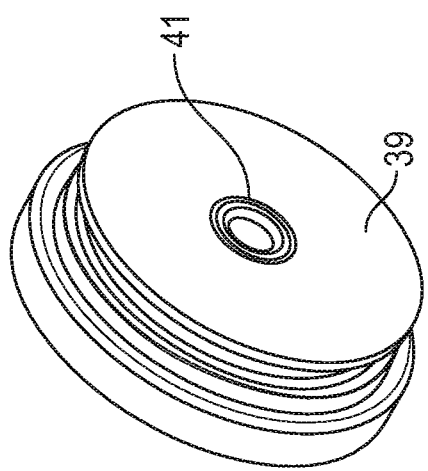

The second ports 38 may be dimensioned or otherwise configured to provide a predetermined pressure drop in production fluid flowing into the base pipe. Thus, over the length of the completion the operator may configure the second ports to provide a desired flow profile taking account of local formation conditions. In one embodiment, each second port 38 is provided with an inflow control device (ICD) assembly in the form of a disc 39 for location in the port 38, the disc having a central flow port accommodating an appropriately sized tungsten carbide insert 41, as illustrated in FIGS. 4a and 4b of the drawings (the skilled person will note that the ports 38 as illustrated in the figures are non-circular, and thus ICDs in the form of discs 39 are intended for use in combination with an alternative embodiment featuring circular second ports). The insert 41 is selected to provide the desired flow area or pressure drop and is pressed into the disc 39, which is then screwed into the port 38 from the outside of the body portion 34a, the disc outer face being provided with a screw thread configured to engage with a corresponding screw thread provided on the port 38. The disc 39 is also provided with an O-ring seal. If appropriate, some ports 38 of a valve arrangement 30 may be fitted with a disc including a blank insert, preventing flow through selected ports.

The valve arrangement 30 includes a primary valve sleeve 46. A central part of the sleeve 46 defines production ports 48 which, when the valve arrangement 30 is in the third configuration, are aligned with the second ports 38. In the first configuration, as illustrated in FIG. 4, the production ports 48 are offset from the second ports 38, and isolated from the exterior of the valve sleeve 46 by seals 50, 51. A further seal 52 also serves to isolate the second port 38. The lower part of the valve sleeve 46 defines an internal profile 55 for engaging an intervention tool, as will be described. The upper end of the sleeve 46 includes collet fingers 49 which have outer profiles for engaging with locating recesses 45 formed in the inner diameter of the body 34. The collet fingers 49 also define profiles 43 which allow for mechanical engagement with an intervention tool if required, as will be described.

Figure 6:
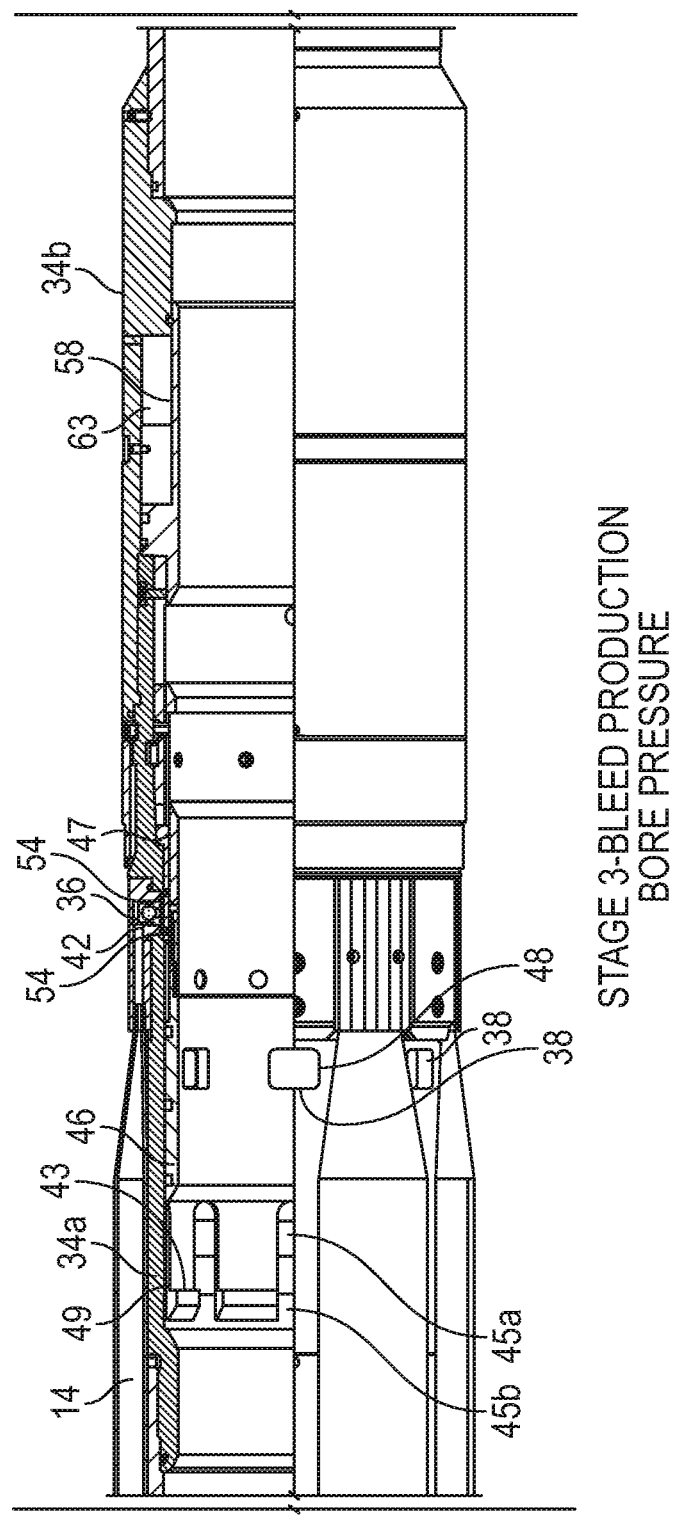
Figure 7:
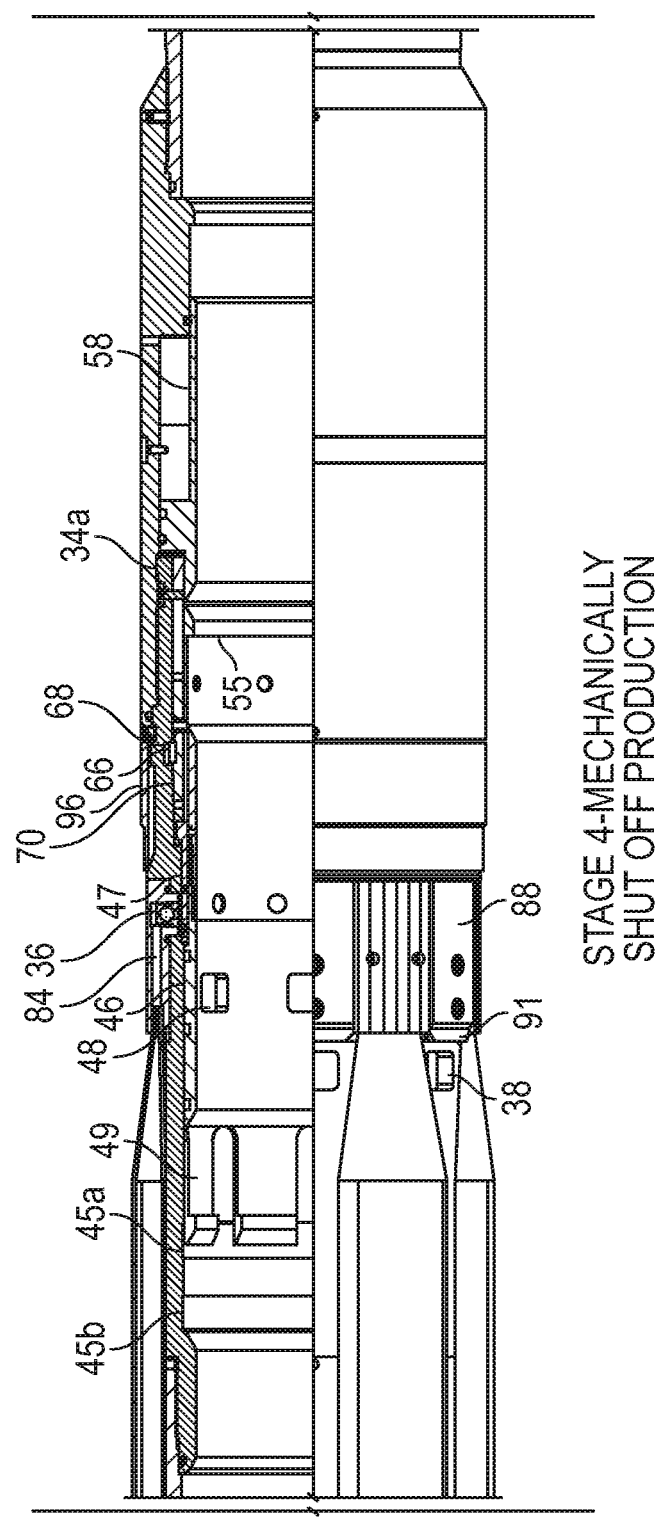

A secondary valve or shuttle sleeve 47 is located externally of the primary valve sleeve 46 and carries external seals 54 for isolation of the first port 36 when the valve arrangement is in the third and fourth configurations, as illustrated in FIGS. 6 and 7. The sleeves 46, 47 are initially fixed together by shear pins 59. In the first and second configurations the shuttle sleeve 47 is located downwards and clear of the first ports 36, and activation ports 56 in the primary valve sleeve 46, which may include a filter member 57, are aligned with the first ports 36, providing for fluid communication between the interior of the screen 10 and the activation chambers 14.

A valve actuating sleeve 58 is also located within the body 34 and features an external shoulder 60 which provides a sealing contact with the body portion 34b. Shear pins 62 initially lock the sleeve 58 relative to the sleeve body against the action of a compression spring 63 contained in a chamber 67 between the sleeve 58 and the body portion 34b. While the upper face of the shoulder 60 is exposed to internal or pipe pressure, the lower face of the shoulder 60 is exposed to external or annulus pressure via a port 61 in the sleeve body, such that the shoulder 60 acts as a differential piston.

Figure 4C:
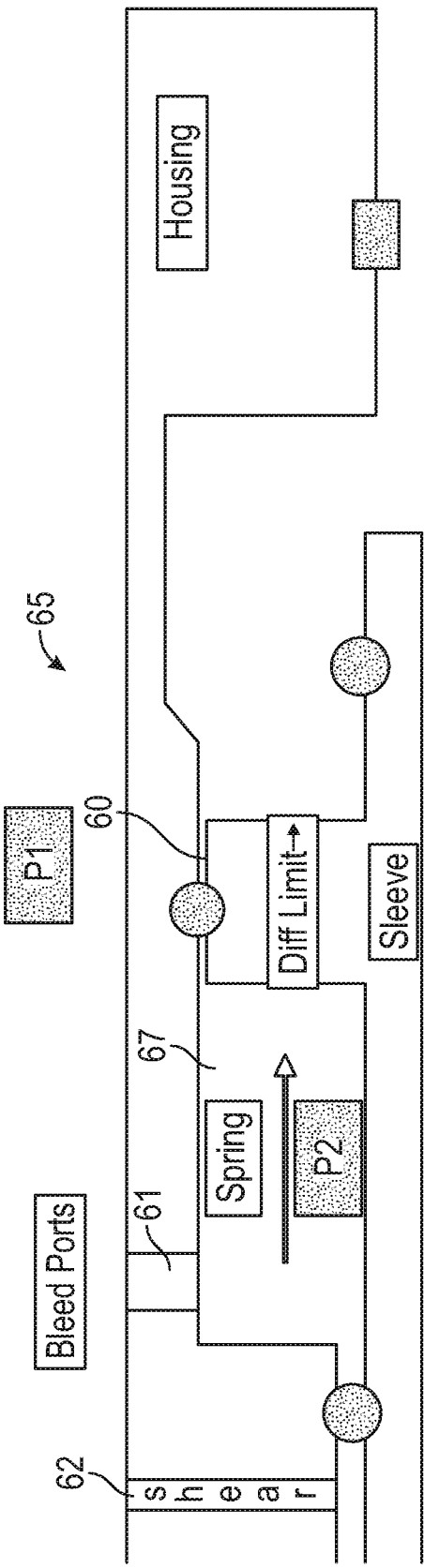
FIG. 4c is a schematic of a check valve.

To prevent accidental unlocking of the sleeve 58 due to reverse differential pressure, for example a rise in annulus pressure relative to internal pressure, check valves 65 (one shown) extend through the shoulder 60, allowing fluid to bleed from the chamber between the sleeve 58 and the body portion 34b and into the valve, thus relieving any excess reverse pressure. A schematic of a check valve 65 is shown in FIG. 4c of the drawings. Accordingly, if, for example, during installation or retrieval of the completion, fluid is being circulated down through the completion and up the surrounding annulus, there may be circumstances in which the annulus pressure (P1) rises above the internal pressure (P3). In this situation, fluid from the annulus may bleed through the port 61 and into the spring chamber 67, undergoing a pressure drop to a lower pressure (P2) in the process. This reduces the pressure differential across the shoulder 60. However, if sufficient, the remaining pressure differential between the chamber 67 and the interior of the completion may then lift the check valve ball 69 off its seat 71, against the action of a spring 73, allowing the fluid to bleed from the chamber 67 and into the completion. Thus, an operator may employ relatively high circulation rates, safe in the knowledge that a higher pressure in the annulus will not result in premature shearing of the pins 62, and premature release of the sleeves 58, 46, 47. The number and configuration of check valves 65 may be selected as appropriate to the completion configuration and anticipated operating conditions.

An upper end of the sleeve 58 extends externally of the lower end of the primary valve sleeve 46, and abuts the lower end of the shuttle sleeve 47.

As noted above, in the first configuration the activation ports 56 are aligned with the first ports 36, while the second ports 38 are closed due to the misalignment between the ports 38 and the production ports 48; the screens 10 are run in hole in this configuration. A positive pressure differential between the interior of the screens 10 and the chambers 14 will open the check valve 42 and allow fluid to flow from the interior of the completion into the activation chambers 14, via the chamber blocks 40. Thus, in use, when the completion is pressurized up to a first pressure, the chambers 14 will undergo an initial degree of inflation or deformation with the valve arrangement 30 in this first configuration. The pipe pressure may be held at this first pressure for a period to provide an initial degree of inflation of the chambers 14. Of course, rather than pressurized the entire completion, an operator may run a wash pipe or the like inside the completion to communicate pressure from surface to the screens 10.

After a predetermined interval the internal pipe pressure may be increased to a higher second level to bring the differential pressure experienced across the shoulder 60 to a level sufficient level to shear the pins 62, as illustrated in FIG. 5. This pressure differential causes the check valve balls 69 to seat, ensuring the check valves 65 remain closed. This results in a small downward movement of the sleeve 58, against the action of the spring 63, until the lower end of the sleeve 58 engages a stop 64. However, this movement is not transferred to the primary valve sleeve 46, or the shuttle sleeve 47. Thus, the first port 36 remains open while the higher second pressure fully inflates and activates the chambers 14.

After a further predetermined interval, following which the operator may be confident that all of the screens 10 have been fully activated, pressure may be bled off from the completion, allowing the spring 63 to move the sleeve 58 upwards relative to the body 34, as illustrated in FIG. 6. After an initial degree of movement, this movement of the sleeve 58 is also translated to the valve sleeves 46, 47, moving the sleeves 46, 47 upwards to close the first ports 36 and open the second ports 38, in particular aligning the ports 38 with the production ports 48 in the sleeve 46. This requires the collet fingers 49 to be dislodged from the lower recess 45a and moved to engage with the upper recess 45b. Furthermore, alignment of the ports 38, 48 is ensured by the provision of timing pins 31, which prevent relative rotation of the body portion 34a and sleeves 46, 47.

In this third valve configuration, high pressure fluid is locked in the inflated chambers 14 by the check valves 42 and the shuttle sleeve 47, while production fluid may flow into the screen through the aligned ports 38, 48.

If any of the valve sleeves 46, 47 do not move to the third configuration when pressure is bled off, an intervention tool may be employed to engage the collet profile 43 and mechanically shift the sleeves 46, 47 upwards. In addition, if at any point in the future an operator wishes to shut off production from a particular screen 10, a mechanical intervention tool may be run into the bore to engage the sleeve profile 55. The primary valve sleeve 46 may thus be pushed downwards, dislodging the collet fingers 49 from the upper recess 45b to the lower recess 45a, such that the ports 38, 48 are moved out of alignment, as illustrated in FIG. 7 of the drawings. However, a split ring 66 located in a recess 68 in the body portion 34a engages with an external shoulder 70 on the upper end of the actuating sleeve 58 preventing downward movement of the sleeve 58 and also locking the shuttle sleeve 47 in the port-closing position. If sufficient force is applied by the intervention tool the connecting shear pins 59 between the sleeves 46, 47 will fail, allowing relative movement of the sleeves 46, 47, such that the first port 36 remains isolated.

Figure 8:
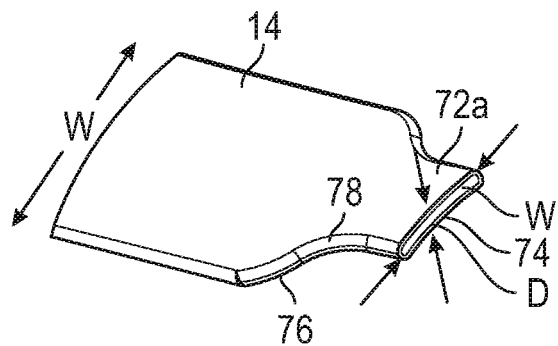
FIGS. 8 and 9 are views of ends of activation chambers of one of the sand screens of FIG. 1.
Figure 9:
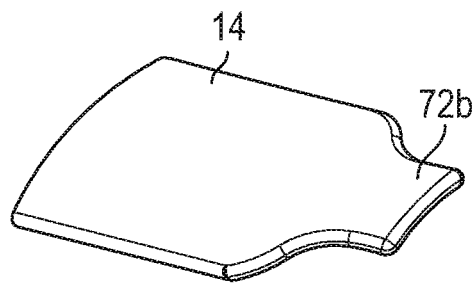
Figure 10:
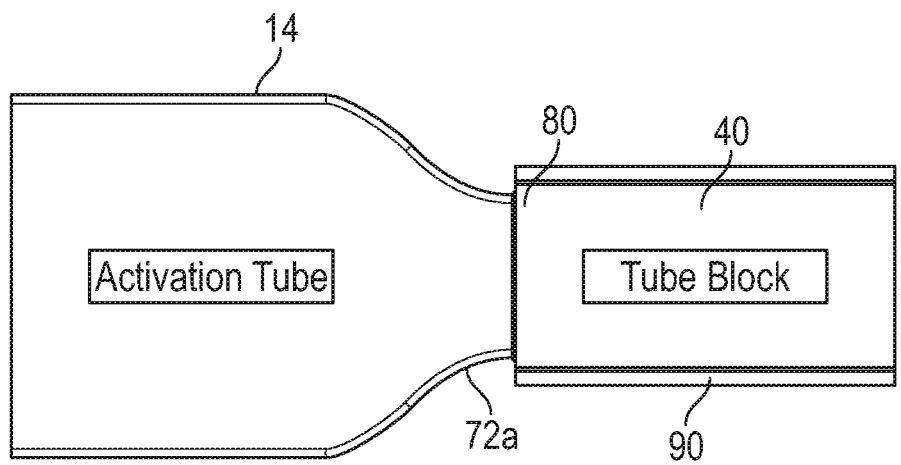
FIGS. 10 and 11 are views of activation chambers and chamber blocks of one of the sand screens of FIG. 1.
Figure 11:
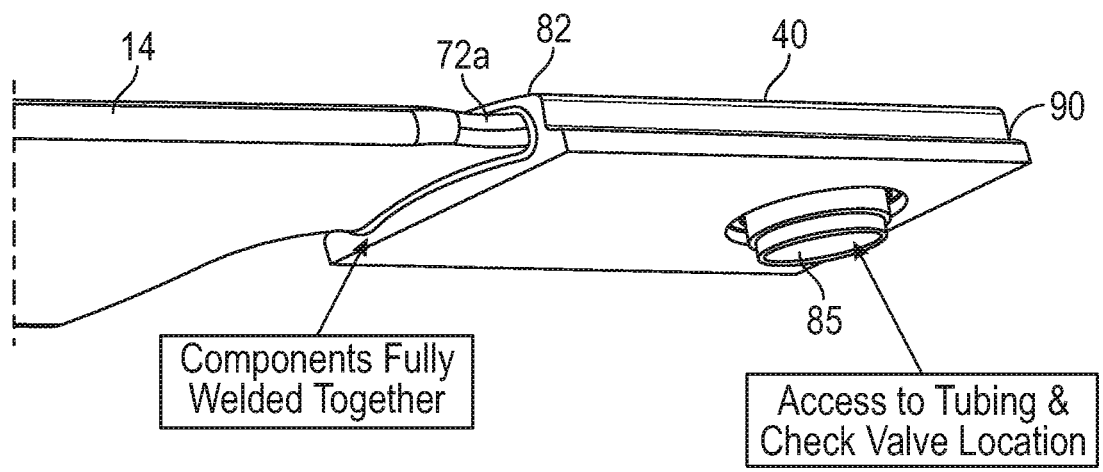

Reference is now made to FIGS. 8, 9, 10 and 11 of the drawings, which illustrate details of the activation chambers 14 and the chamber blocks 40. In particular, FIG. 8 shows the lower end of an activation chamber 14, while FIG. 9 shows the upper end of an activation chamber 14. The activation chambers 14 are elongate and have a width W and depth D. In one embodiment, the chambers 14 are formed by folding a long narrow sheet of metal in a series of steps to provide the desire profile, the meeting edges then being joined by a suitable method, for example being laser or high frequency welded. However, both ends of the chambers are cut away to provide a narrow tab or spigot 72. The cut metal edges which define the lower spigot 72a are welded to leave an opening for passage of fluid, while the upper spigot 72b is welded closed. Thus, the opening 74 on the lower spigot 72a is of a width w, less than the chamber width W. Also, the edges defining the transition from the full width chamber to the spigots 72 are radiused, in particular being formed with an outer radius 76 and an inner radius 78. On inflation or deformation of the chambers 14, the outer radius 76 reduces the stresses at the end of the chambers 14, reduces the shrinkage in length during activation, reduces the potential for damaging the weave 22, and smoothes out the end profile of the deformed chamber 14. The inner radius 78 reduces stresses in the transition area during activation.

The open spigot 72a allows for fluid communication between the activation chamber 14 and the interior of the completion, via the chamber block 40 which includes an opening 80 in an end face to receive the spigot 72a. The spigot 72a and chamber block 40 are assembled while separated from the screen body, and the components are then bonded together around the complete perimeter of the opening 80 to provide pressure integrity, the bond 82 being perhaps most clearly visible in FIG. 11 of the drawings. The bond 82 may be provided by any suitable method, typically welding, for example TIG, laser or robotic welding.

Within the chamber block 40 there is a drilled hole 84 (FIG. 7), which extends to intercept a radial recess 85 which accommodates the check valve 42.

The closed spigot 72b is restrained by an alternative clamp body (not shown). The upper end of the chambers 14 may be fixed to the respective upper clamp body or be mounted to permit a degree of axial movement, for example to allow for axial shrinkage of the chamber 14 on inflation. In other embodiments the spigot 72b may be provided with a relief valve to protect against over-pressurization of the chambers 14, or may provide fluid communication with other activating chambers in the same or an adjacent assembly.

The chamber blocks 40 are retained in place on the screen body 34a by clamps 88 (FIG. 7) which are bolted to the body 34a and engage with shoulders 90 formed on the edges of the blocks 40.

Figure 12A:
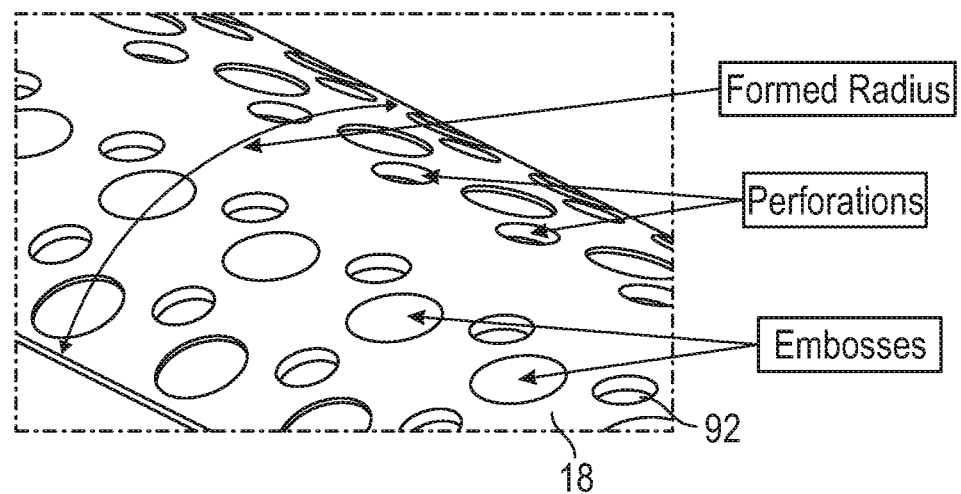
FIGS. 12a and 12b are views of elements of a drainage layer of one of the sand screens of FIG. 1.
Figure 12B:
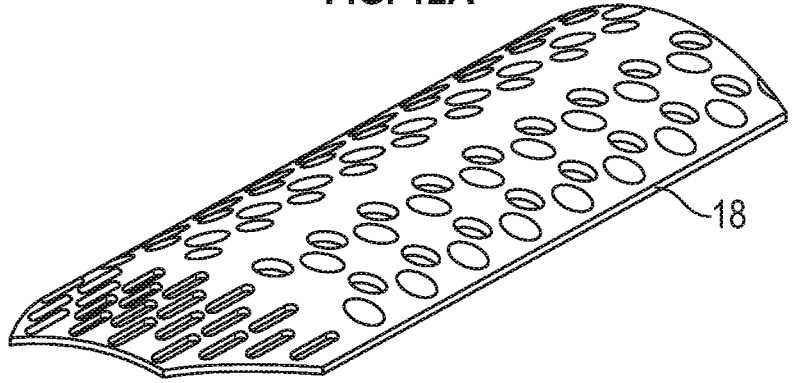

As noted above, drainage strips 18 are mounted externally of the mounted chambers 14, and parts of a drainage layer strip 18 are illustrated in FIGS. 12a and 12b of the drawings. In use, the drainage layer formed by the strips 18 lifts the weave 22 from the activating chambers 14, maximising inflow through and around the screen. The strips 18 are of solid steel plate provided with perforations 92 which allow oil or gas to flow through weave 22 and into the screen 10. The strips are produced by punching and embossing flat plate to provide the required pattern, before roll forming to the required radius and then cutting to length. The perforations 92 may be any appropriate shape or size, and in the illustrated embodiment each strip 18 includes four axial rows of round holes. As noted above, the strips 18 are also embossed to form protrusions on the inner surface of the strips 18, to lift the drainage layer up from the activation chambers 14 to permit flow under the layer and between the activating chambers 14 and the strips 18. Again, the embosses 94 may be any appropriate shape, size or depth, and in the illustrated embodiment the embosses 94 are formed as four axial rows, axially and circumferentially offset from the perforations 92. The strips 18 are formed with an inner radius to match the outer radius of the activation chambers 14 to ensure that the outer diameter of the screen 10 is minimised and that the drainage layer formed by the strips 18 provides optimum support across the activation chambers 14.

The ends of the strips 18 are tapered and are secured on the screen 10 by welding to shoulders 91 (FIG. 7) provided on the chamber block clamps 88. The strip ends are also slotted to facilitate deformation; the strip ends must bend and extend to accommodate the activation of the chambers 14.

Following activation and deformation of the chambers 14 the drainage layer strips 18 provide support to the weave 22 as the gaps 20 (FIG. 3) between the activation chambers 14 increases. Also, the radiused strips 18 assist in maintaining a substantially circular shape during the activation process. In the absence of such support, the screen would assume a hexagonal shape due to the weave 22 and the outer shroud 24 forming straight lines between each activation chamber outer diameter.

Figure 13:
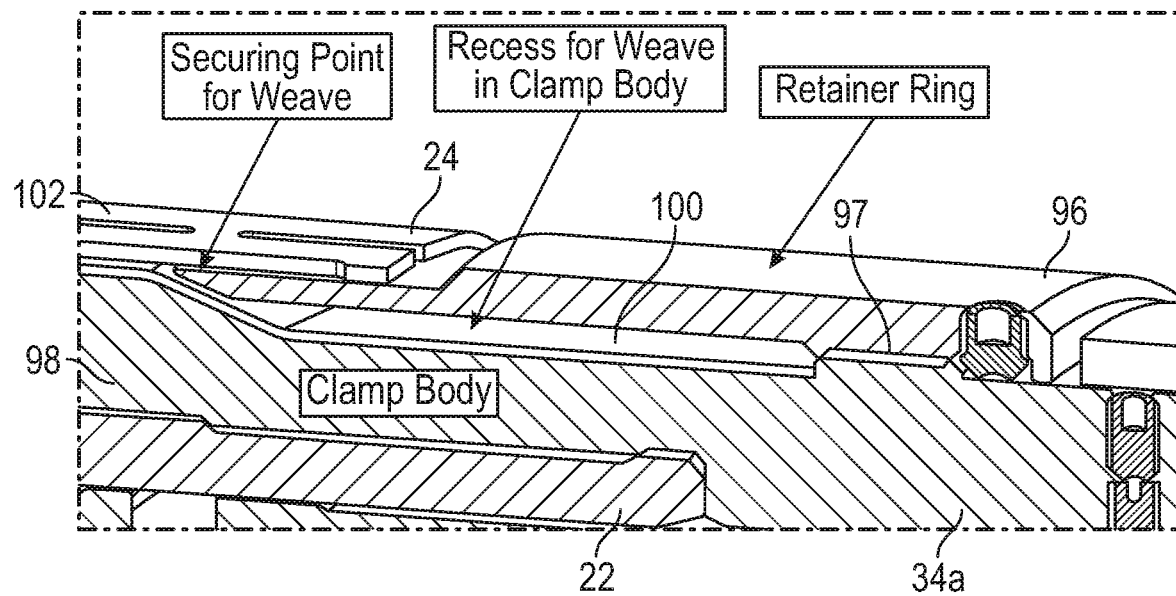
FIG. 13 is a sectional view of a clamp arrangement of one of the sand screens of FIG. 1.

Reference is now also made to FIG. 13 of the drawings, which illustrates a clamp arrangement for use in securing the weave 22 in place on the screen 10. The Figure shows the body portion 34a which serves as a clamp body and a retainer ring 96 which may be threaded to the body 34a. The clamp body 34a defines a recess 100 upwards of the thread 97, and a tapering surface 98 leading down into the recess 100. The ring 96 includes a corresponding tapering surface 102 on its upper end, such that when the ring 96 is tightened on the body 34a the surfaces 98, 102 come together and clamp a portion of the weave 22 therebetween.

During the fabrication process, the weave 22 is wrapped around the screen body, over the drainage layer formed by the strips 18, with the upper and lower ends of the weave 22 positioned in the recesses 100 (a similar clamping arrangement is provided at the upper end of the screen).

The weave 22 may be held in place using ratchet straps, spot welding or the like, and if desired the weave 22 may be spot welded in the recess 100. Spot welds may also be provided along the length of the screen 10, to secure the weave 22 to the strips 18. The clamping ring 96 is then screwed on to the clamp body 34a and the taper surfaces 98, 102 clamp and secure the weave 22. The shroud 24 is then located over the clamped weave 22.

Figure 14:
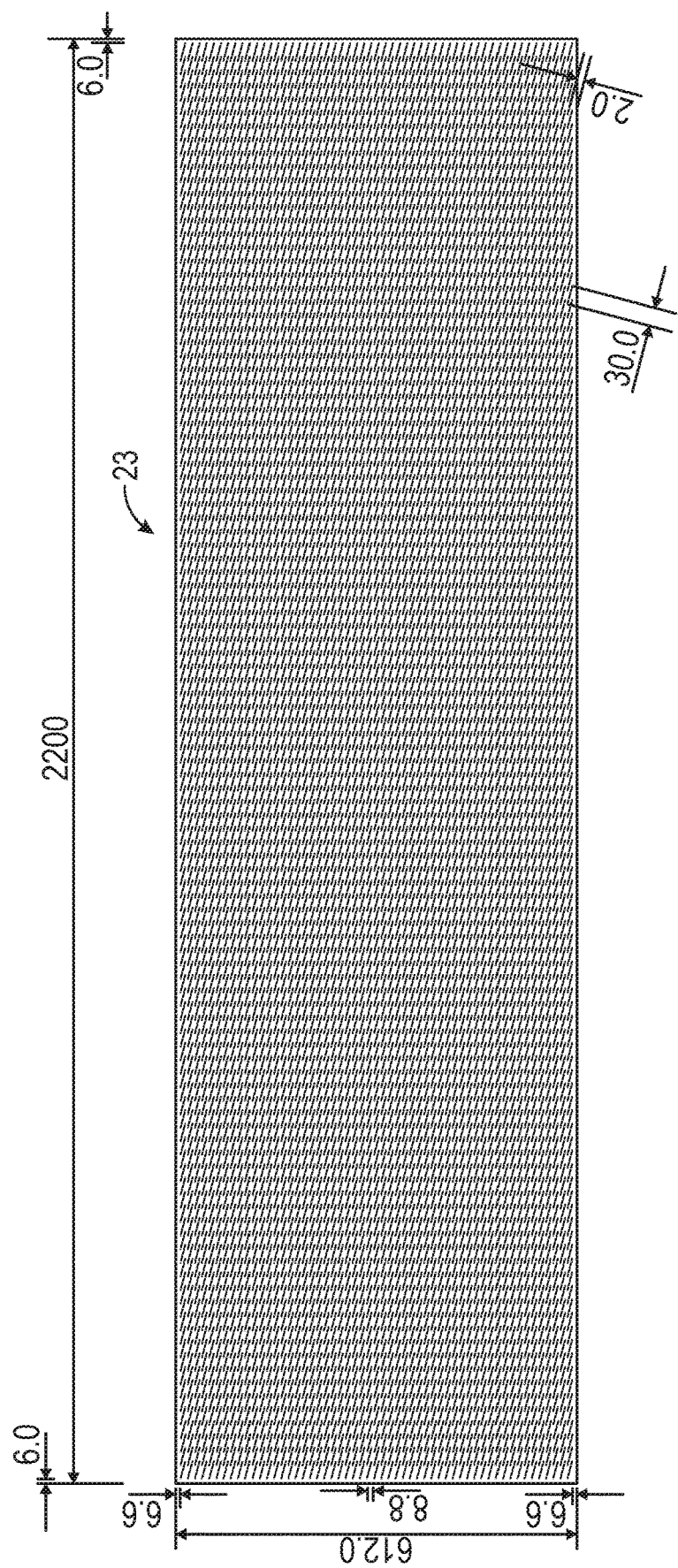
FIG. 14 is a plan view of a sheet to be formed into a sand screen shroud.
Figure 15:
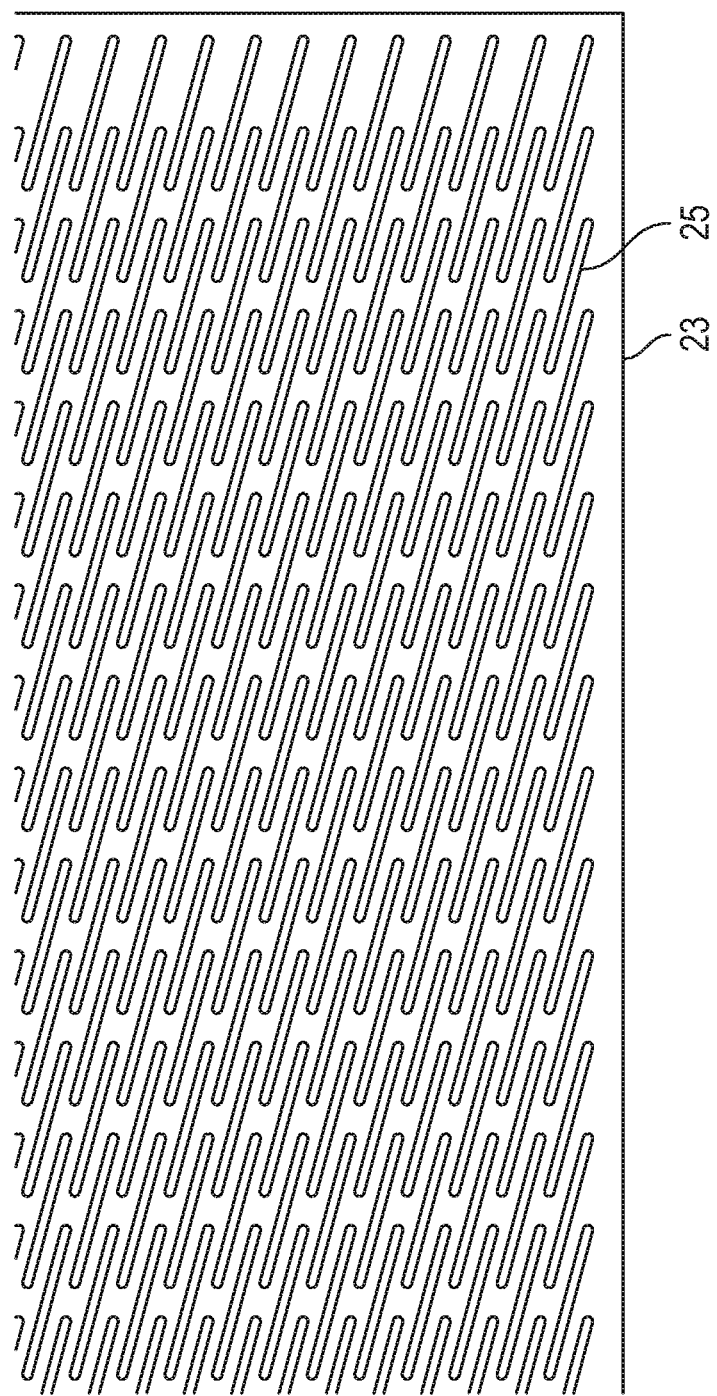
FIG. 15 is an enlarged view of a portion of the sheet of FIG. 14.

Reference is now made to FIGS. 14 and 15 of the drawings, which illustrate details of the apertured sheet or plate 23 utilized to form the shroud 24. Conventional shrouds are formed with elongate longitudinally extending overlapping slots, and on expansion of the sand screen the slots open to accommodate the increase in the circumference described by the shroud; the shroud is intended to provide a degree of protection for the weave but is intended to be readily extendable such that the expansion of the weave is not restricted. The screen 10 may be provided with such a conventional shroud. However, the shroud 24 of the illustrated embodiment of the present invention features 30 mm long slots 25 which are inclined at 15 degrees along the plate length. This results in a shroud 24 which will require greater pressure to expand, thus providing greater control of the activation pressure required to initiate expansion of the screen 10. The angled slots 25 also result in less friction between the outer surface of the weave 22 and the inner surface of the shroud 24 as the slots 25 open and the weave 22 slides underneath the shroud 24.

Figure 16:
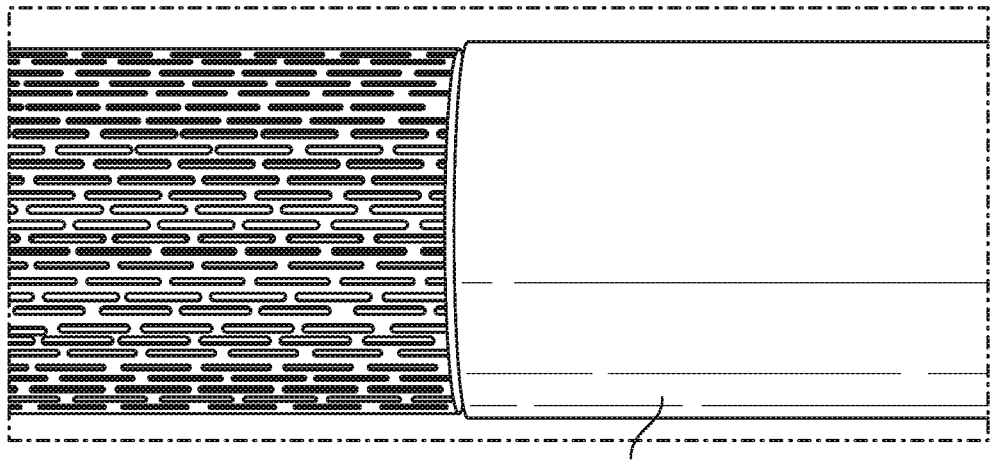
FIGS. 16 and 17 are views of a sand screen in accordance with a further embodiment of the present invention.
Figure 17:
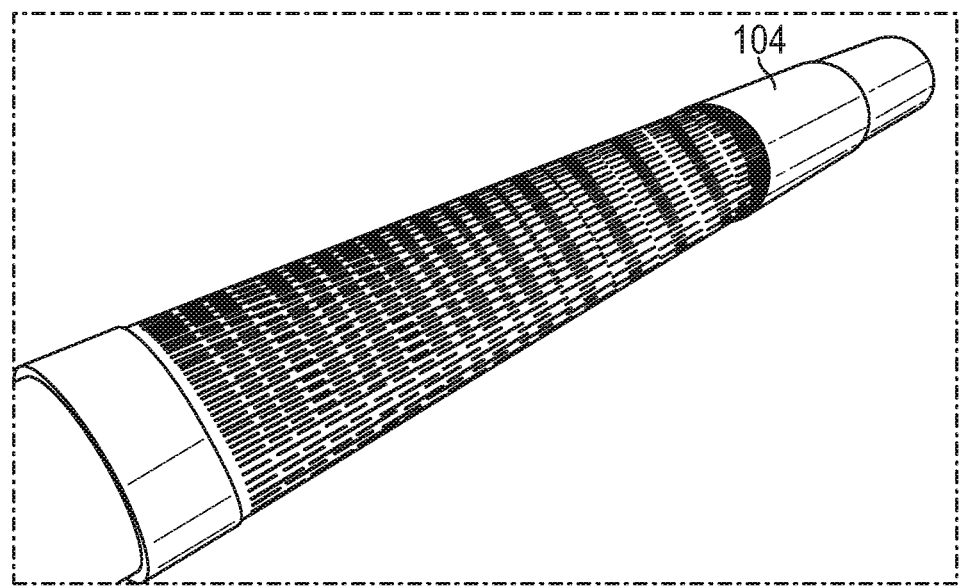
Figure 18:
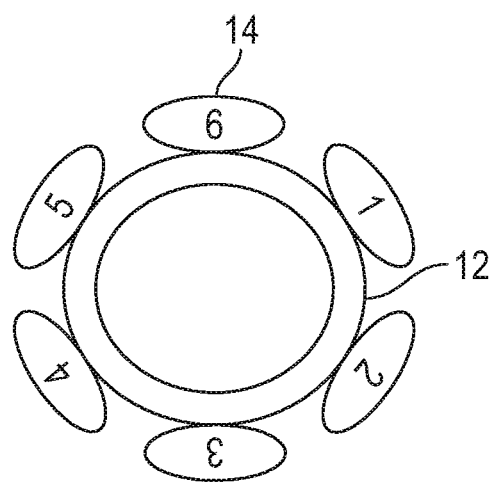
FIGS. 18, 19, 20 and 21 are schematic sectional views of structures in accordance with embodiments of the present invention.

For most applications it is envisaged that the shroud 24 will form the outer surface of the screen. However, in some embodiments a portion of the screen may be covered with an elastomer, as illustrated in FIGS. 16 and 17 of the drawings. In this embodiment a neoprene elastomer coating 104 has been wrapped around a portion of the screen outside diameter. Once such a screen has been activated, the rubber coating 104 will be pushed out against the surrounding casing or formation and will provide a restriction or baffle to the flow of production fluids between zones; the coating 104 may provide a low pressure seal or a restriction to flow of fluid past the screen, but may permit fluid to flow beneath the coating 104 and into or along the screen. Of course in other embodiments different qualities of material may be utilized to provide a higher pressure seal.

Reference is now made to FIGS. 18, 19, 20 and 21 of the drawings which are schematic sectional view of structures in accordance with various further embodiments of the present invention. In the screens described above, and as illustrated in FIG. 18, activation chambers 14 are arranged around a circular base pipe 12. Testing has demonstrated that the provision of inflated activation chambers 14 on the outside diameter of the base pipe 12 contained within a bore creates a structure with significantly enhanced crush resistance when compared to a structure consisting essentially of a base pipe 12 alone. It is believed this is due, at least in part, to the cushioning effect of the activation chambers 14, compression of an inflated activation chamber 14 by an externally applied mechanical load leading to an increase in internal fluid pressure which results in the load being spread along the length of the chamber 14 and radially around the screen.

Also, when such a structure is subject to a high load on one side of the structure the pressure increases in the chambers on the other side of the structure: for example, if a high load is applied in the region of the chamber 14(6), an elevated pressure is measured in the opposite chamber 14(3), and to a lesser extent in adjacent chambers 14(4) and 14(2). Testing has further demonstrated that the chambers 14 tend to absorb at least initial deformation of the structure, such that the internal diameter of the base pipe 12 remains substantially unobstructed. Also, the deformed chambers 14 tend to recover, typically by around 50%, when the applied force is reduced.

Testing also identified that the sand integrity of sand screens incorporating inflated chambers 14 as described herein when subject to crush or pinch loads was maintained at very high loading, as was the integrity of the chambers 14. In one test the pressure in the chambers 14 increased from an initial 1000 psi to almost 1200 psi, corresponding to a 1 inch deformation of a sand screen with an activated outer diameter of 8½ inches. Thus, a sand screen in accordance with an embodiment of the present invention will withstand significant crush loading, for example from a swelling or partially collapsing formation, and will accommodate a degree of deformation without adversely affecting the base pipe 12. Of course this effect is not limited to sand screen, and inflatable chambers may be mounted on an impervious section of a completion intended to intersect a non-producing problem formation. Accordingly, an operator may be able to utilize significantly lighter and less expensive base pipe 12, and may be able to drill and then maintain bores through difficult formations, for example swelling formations which would otherwise be expected to crush bore lining tubing located in the bores.

Figure 19:
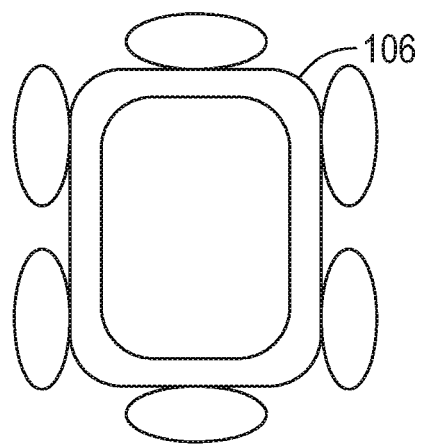
Figure 20:
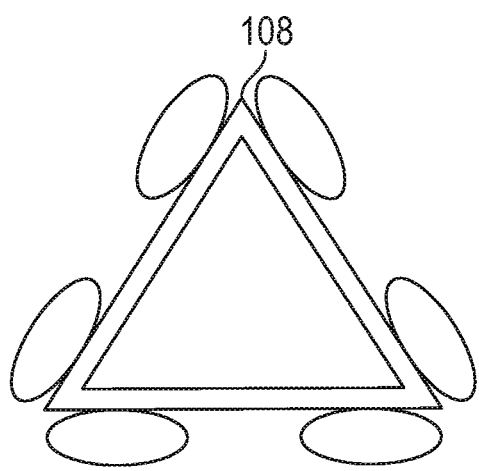
Figure 21:
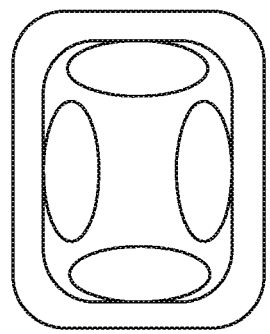

FIGS. 19, 20 and 21 illustrate that this principle may be employed to increase the collapse and crush resistance of other tubular forms, such as the rectangular and triangular base pipes 106, 108 of FIGS. 19 and 20, and also in providing protection against internal loads as illustrated in FIG. 21.

It will be apparent to those of skill in the art that the above described embodiments are merely exemplary of the present invention, and that various modifications and improvements may be made to these embodiments without departing from the scope of the invention.

The invention claimed is:
1. A downhole apparatus comprising:
a tubular body;
first and second ports in a wall of the body, and
a fluid pressure-responsive valve arrangement having a locked first configuration associated with a first pressure in which the first port is open and the second port is closed, an unlocked second configuration associated with a second pressure higher than the first pressure in which the first port is open and the second port is closed, and a third configuration associated with a third pressure lower than the second pressure in which the second port is open and the first port is closed;
wherein the first port provides fluid communication with a first device;
wherein the first device comprises a fluid-deformable device; and
wherein the fluid-deformable device supports a sand screen, such that the downhole apparatus may be utilised to facilitate fluid pressure activation of a sand screen.

2. The downhole apparatus of claim 1, wherein the fluid-deformable device comprises a chamber mounted on the body.

3. The downhole apparatus of claim 1, comprising fluid deformable chambers mounted on the body, wherein the fluid deformable chambers are adapted to be activated by fluid passing through the first port.

4. The downhole apparatus of claim 3, wherein the fluid deformable chambers are adapted to load or compress material between the fluid deformable chambers and a bore wall.

5. A flow control method comprising:
applying a first pressure to at least one fluid pressure-responsive valve arrangement controlling the configuration of first and second ports in a wall of a tubular body, whereby the at least one valve arrangement maintains a locked first configuration in which the first port is open and the second port is closed;
applying a second pressure higher than the first pressure whereby the at least one valve arrangement assumes an unlocked second configuration in which the first port is open and the second port is closed; and
applying a third pressure lower than the second pressure whereby the at least one valve arrangement assumes a third configuration in which the second port is open;
communicating fluid through the first port to a first device;
communicating fluid through the first port to at least one fluid-deformable device;
supporting at least one sand control element on the fluid-deformable device; and
communicating fluid to the at least one fluid-deformable device to activate the at least one sand control element.

6. The method of claim 5, comprising providing the at least one fluid-deformable device on the tubular body.

7. The method of claim 6, wherein providing the at least one fluid pressure-responsive valve arrangement on the tubular body comprises providing a plurality of fluid pressure-responsive valve arrangements on the tubular body to form part of a completion wherein each fluid pressure-responsive valve arrangement is associated with a respective first port and respective second port in the wall of the tubular body, the method further comprising providing a plurality of sand screens, each one of the plurality of sand screens associated with one of the plurality of fluid pressure-responsive valve arrangements, wherein the respective first ports associated with the plurality of fluid pressure-responsive valve arrangements communicate with respective fluid deformable devices of each of the plurality of fluid pressure-responsive valve arrangements, and providing a plurality of filter members, each one of the plurality of filter members supported by the fluid deformable devices of a respective one of the fluid pressure-responsive valve arrangements.

8. The method of claim 7, further comprising running the completion into a drilled hole to a desired depth with each of the fluid pressure-responsive valve arrangements in the first locked configuration.

9. The method of claim 8, comprising applying the first pressure to an interior of the tubular body and passing fluid through the first ports to simultaneously inflate each of the fluid-deformable devices and increase the diameter of each of the sand screens to locate each of the filter members against a surrounding bore wall or casing.

10. The method of claim 9, comprising applying the second pressure to the interior of the tubular body such that each fluid pressure-responsive valve arrangement assumes the second configuration.

11. The method of claim 10, wherein at least one of the fluid pressure-responsive valve arrangements further comprises: a valve member in the form of a sleeve which incorporates a differential piston, wherein the sleeve is initially locked in an initial position with respect to the tubular body by a shear pin, whereupon when the second pressure is applied to the interior of the tubular body the shear pin is sheared and the sleeve moves against the action of a spring to a second position with respect to the tubular body, which maintains the first port open and the second port closed.

12. The method of claim 11, comprising applying a fourth pressure to the interior of the tubular body, the fourth pressure higher than the second pressure, to fully inflate the fluid-deformable devices of the at least one of the fluid pressure-responsive valve arrangements.

13. The method of claim 12, wherein the second pressure, the pressure necessary to shear the shear pin, is 50-70% less than the fourth pressure, the pressure necessary to fully inflate the fluid deformable devices of the at least one of the fluid pressure-responsive valve arrangements.

14. The method of claim 12, comprising maintaining the fourth pressure to apply a stress to the surrounding borehole or casing wall.

15. The method of claim 12, comprising bleeding pressure off from the fourth pressure in the interior of the tubular body, whereby check valves associated with the first port associated with the at least one of the fluid pressure-responsive valve arrangements lock the fourth pressure inside the fluid-deformable devices of the at least one of the fluid pressure-responsive valve arrangements.

16. The method of claim 15, comprising bleeding further pressure off from the interior of the tubular body, thereby moving the sleeve to close the first port associated with the at least one of the fluid pressure-responsive valve arrangements and open the second port associated with the at least one of the fluid pressure-responsive valve arrangements.

17. The method of claim 16, further comprising locating an additional barrier to close the first port associated with the at least one of the fluid pressure-responsive valve arrangements.

18. The method of claim 16, comprising flowing production fluid from the formation, through the second port associated with the at least one of the fluid pressure-responsive valve arrangements and into the interior of the tubular body, and then to surface, or flowing fluid from the interior of the tubular body, through the second port associated with the at least one of the fluid pressure-responsive valve arrangements and info the formation.

* * * * *